(12) United States Patent
Yamashita et al.

(10) Patent No.: US 7,649,381 B2
(45) Date of Patent: Jan. 19, 2010

(54) LEVEL CONVERSION CIRCUIT

(75) Inventors: Hiroki Yamashita, Hachioji (JP); Fumio Yuuki, Fujimino (JP); Ryo Nemoto, Kokubunji (JP); Hisaaki Kanai, Yokohama (JP); Keiichi Yamamoto, Yamato (JP)

(73) Assignee: Hitachi, Ltd., Tokyo (JP)

( * ) Notice: Subject to any disclaimer, the term of this patent is extended or adjusted under 35 U.S.C. 154(b) by 4 days.

(21) Appl. No.: 12/000,608

(22) Filed: Dec. 14, 2007

(65) Prior Publication Data
US 2008/0157816 A1 Jul. 3, 2008

(30) Foreign Application Priority Data
Dec. 28, 2006 (JP) .............. 2006-353595

(51) Int. Cl.
*H03K 19/094* (2006.01)
(52) U.S. Cl. .............. 326/68; 326/81; 326/127
(58) Field of Classification Search ............ 326/68, 326/81, 63; 327/333; 330/253
See application file for complete search history.

(56) References Cited
U.S. PATENT DOCUMENTS

| | | | |
|---|---|---|---|
| 4,697,110 A | 9/1987 | Masuda et al. | |
| 5,369,318 A | 11/1994 | Kuroda et al. | |
| 6,388,433 B2 * | 5/2002 | Marty | 323/284 |
| 7,075,342 B2 * | 7/2006 | Nishimura | 327/108 |
| 7,332,916 B2 * | 2/2008 | Nagata | 324/713 |
| 2006/0197697 A1 * | 9/2006 | Nagata | 342/22 |
| 2008/0001661 A1 * | 1/2008 | Tachibana et al. | 330/253 |

FOREIGN PATENT DOCUMENTS

| | | |
|---|---|---|
| JP | 59-099819 | 11/1982 |
| JP | 06-013878 | 6/1992 |

\* cited by examiner

*Primary Examiner*—Vibol Tan
(74) *Attorney, Agent, or Firm*—Stites & Harbison PLLC; Juan Carlos A. Marquez, Esq.

(57) ABSTRACT

A level conversion circuit capable of realizing low-power/high-speed operation and suppression of variations in input/output characteristics due to variations in source voltage and temperature and device variation. The level conversion circuit comprises: a source follower circuit including a first transistor to input an AC signal of CML level thereto and a second transistor to input a control voltage thereto; and a control-voltage generating circuit to generate the control voltage to be inputted to the second transistor. The control-voltage generating circuit comprises: a replica source follower circuit which is a replica of the source follower circuit including a third transistor to input a central voltage of CML level thereto and a fourth transistor to input the control voltage thereto; and a comparator which controls the control voltage, thereby equalizing an output voltage of the replica source follower and a threshold voltage of a CMOS circuit.

4 Claims, 6 Drawing Sheets

DUTY RATIO = TW/TC×100% >> 50%

LEVEL CONVERSION CIRCUIT

CROSS-REFERENCE TO RELATED APPLICATION

The present application claims priority from Japanese Patent Application No. JP 2006-353595 filed on Dec. 28, 2006, the content of which is hereby incorporated by reference into this application.

TECHNICAL FIELD OF THE INVENTION

The present invention relates to a level conversion circuit. More particularly, the present invention relates to a technology effectively applied to a circuit configuration for converting AC (Alternating Current) signals from a CML (Current Mode Logic) level to a CMOS (Complementary Metal Oxide Semiconductor) level.

BACKGROUND OF THE INVENTION

As a technology studied by the inventors of the present invention, for example, about a level conversion circuit, the following technology is considered.

FIG. 1 shows one example of input/output voltage waveforms of a level conversion circuit for conversion from a CML level to a CMOS level. In FIG. 1, the input of the level conversion circuit has a CML level (1.2V/0.9V) and the output has a CMOS level (1.2V/0V).

Application to a high-speed SerDes (Serializer Deserializer) requires a high-speed/low-power operation (5 GHz) and a Duty ratio compensation in addition to the level conversion function (1.2V/0.9V to 1.2V/0V). The Duty ratio herein means a value to quantitatively describe a distortion of pulse width, i.e., a ratio between a pulse width TW and a cycle time TC (Duty ratio=(TW/TC)·100%). Specifically, in a high-speed interface circuit premising a half-rate operation (a system of operating all circuits in sync referencing a rising time and a falling time of a clock pulse), a reference time of the operation depends on the Duty ratio. Thus, it is very important to keep the Duty ratio at 50%. Note that, in the study herein, based on a 90 nm CMOS device, a source voltage VDD is 1.2 V and Low/High levels of a signal are 0.9V/1.2V for CML level and 0V/1.2V for CMOS level.

Conventionally, such a level conversion circuit generally uses a differential circuit having a high gain as shown in FIG. 2. FIG. 2 is a circuit diagram showing a configuration of a conventional level conversion circuit.

Meanwhile, the applicants have done a prior art search based on the result of the invention. As a result, Japanese Patent Application Laid-Open Publication No. 59-099819 (Patent Document 1) and Japanese Patent Application Laid-Open Publication No. 06-013878 (Patent Document 2) were extracted. Patent Document 1 discloses a level-shift circuit in FIG. 5 thereof and a generation circuit of reference voltage $V_{CONT}$ using the same level-shift circuit (replica) of FIG. 5 in FIG. 8. However, there is no description about a comparison circuit. And, Patent Document 2 discloses that "control is made . . . to match a first reference potential Vref1 which is outputted as a central potential of CMOS level and a second reference potential Vref2 which is outputted as a central potential of ECL level" in the Abstract. However, there is no description about a source follower circuit.

SUMMARY OF THE INVENTION

Here, according to the study by the inventors of the present invention about the technology of a level conversion circuit as described above, the following have revealed.

For example, there are two problems in the circuit of FIG. 2. The first problem is that this is an unsuitable circuit system for lowering power consumption. The reason is that this circuit system has an operation speed proportional to a current-switching current Ics and a large direct current Ics is thus required in order to realize high-speed operation. The second problem is that a threshold voltage of the circuit Vcth varies due to variations in source voltage and temperature, device variation and the like, and thus the Duty ratio of the output waveform may be distorted.

FIG. 3 is a diagram showing an input/output characteristic of the conventional level conversion circuit. As shown in FIG. 3, when variations in source voltage and temperature and device variation occur, the input/output characteristic of the circuit varies, thereby varying the threshold voltage of the circuit Vcth (input voltage whose output changes from High level to Low level).

FIG. 4 is a waveform diagram showing a Duty ratio in a case where the threshold voltage Vcth of a level conversion circuit is varied. For example, as shown in FIG. 4, when the threshold voltage of the circuit is shifted to the lower side, due to the low threshold voltage of the circuit, the time to start a transition from High level to Low level in a switching of the output is delayed compared to a transition from Low level to High Level of the input. As a result, the output waveform has a High level period (TW) longer than a Low level period, and the Duty ratio is largely shifted away from that of 50%.

In addition, as a level conversion circuit in which its threshold voltage of the circuit Vcth is adjusted, a circuit shown in FIG. 5 is considered. FIG. 5 is a circuit diagram showing a configuration of a circuit studied by the inventors of the present invention as a premise of the present invention. This circuit includes a ring oscillator 501 inside the dotted line. The ring oscillator 501 is configured by: a first-stage source follower circuit 502; a CMOS circuit (dummy) 503 same as that of a next stage; a level shift circuit LS; an oscillation-preventing capacitor C; and the like. The ring oscillator 501 gets an input of a threshold voltage of a CML circuit Vcmlth (central voltage of CML circuit) and outputs a control voltage Vc to a next-stage source follower 504. It is a method to obtain the control voltage Vc, which makes an output of the first-stage source follower circuit 502 to be nearly same with a central voltage (threshold voltage of a circuit) of a next-stage CMOS circuit 505. However, the circuit of FIG. 5 has problems including requirement of a large oscillation-preventing capacitor C and variations in the level shift circuits.

Accordingly, an object of the present invention is to provide a technology of a level conversion circuit capable of realizing a low-power/high-speed operation.

Further, another object of the present invention is to provide a technology of a level conversion circuit capable of controlling variations in input/output characteristics due to variations in source voltage and temperature and variations in device characteristics.

The above and other objects and novel characteristics of the present invention will be apparent from the description of this specification and the accompanying drawings.

The typical ones of the inventions disclosed in this application will be briefly described as follows.

More specifically, a level conversion circuit of the present invention is a level conversion circuit which converts an AV signal from a CML level to a CMOS level. The level conversion circuit comprises: a source follower circuit including a first transistor to which an AC signal of CML level is inputted and a second transistor to which a control voltage is inputted; and a control-voltage generating circuit for generating the control voltage to be inputted to the second transistor. The control-voltage generating circuit comprises: a replica of the source follower circuit including a third transistor to which a central voltage of CML level is inputted and a fourth transistor to which the control voltage is inputted; and a comparison circuit for controlling the control voltage so as to equalize an output voltage of the replica of the source follower circuit and a threshold voltage of a next-stage CMOS circuit.

The effects obtained by typical aspects of the present invention will be briefly described below.

(1) Power reduction is realized by reducing a DC current of a source follower circuit which is a DC path.

(2) Distortion of an output pulse width due to variations in source voltage and temperature and device variation is compensated by controlling a gate voltage of a lower-stage MOS transistor of a source follower circuit by a threshold voltage of a next-stage CMOS circuit.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Figure 1:
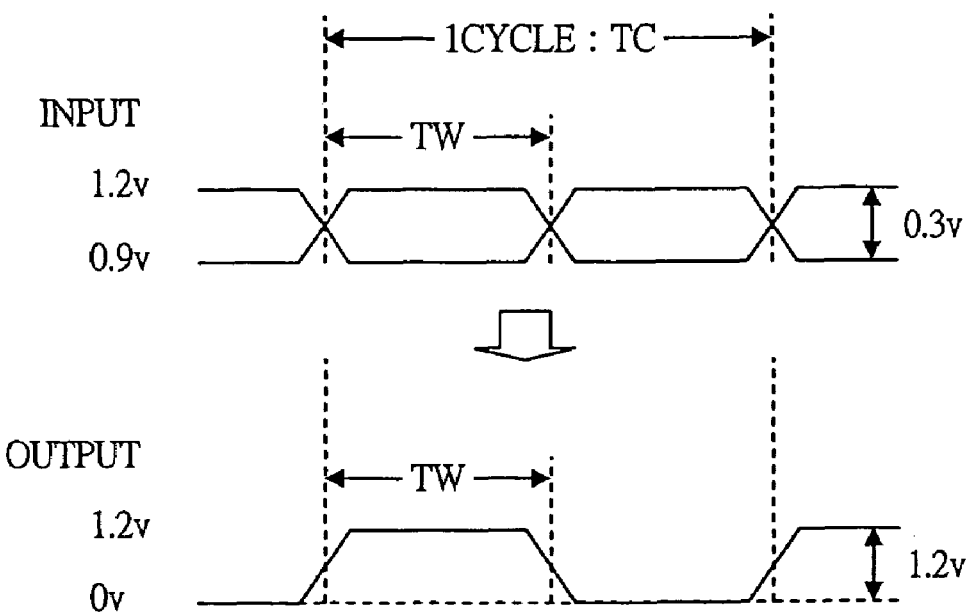
FIG. 1 is a diagram showing one example of input/output waveforms of a level conversion circuit for conversion from a CML level to a CMOS level.
Figure 2:
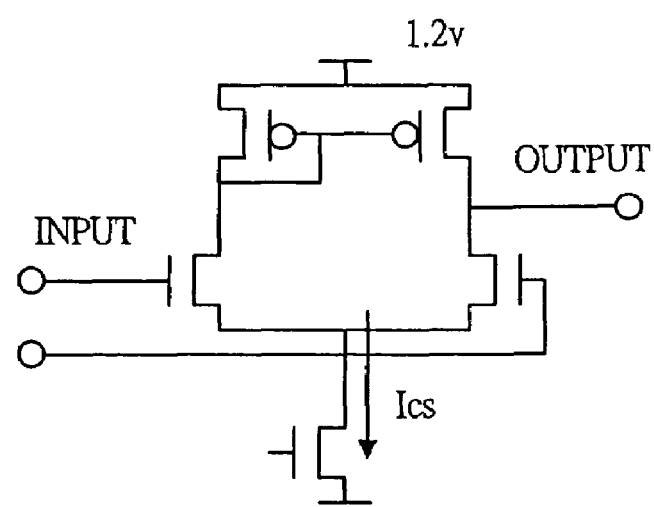
FIG. 2 is a circuit diagram showing a configuration of a conventional level conversion circuit.
Figure 3:
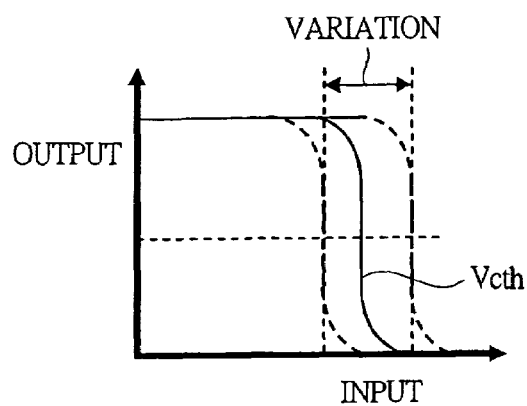
FIG. 3 is a diagram showing an input/output characteristic of the conventional level conversion circuit.
Figure 4:
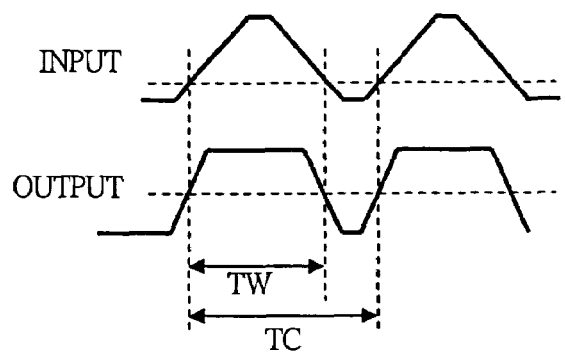
FIG. 4 is a waveform diagram showing a Duty ratio in a case where a threshold voltage of a level conversion circuit Vcth is varied.
Figure 5:
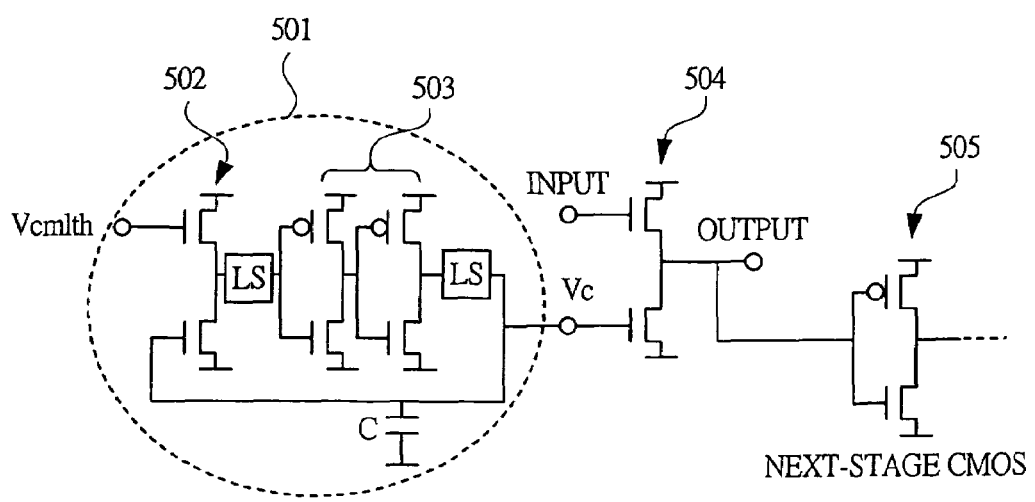
FIG. 5 is a circuit diagram showing a configuration of a level conversion circuit studied as a premise of the present invention.
Figure 6:
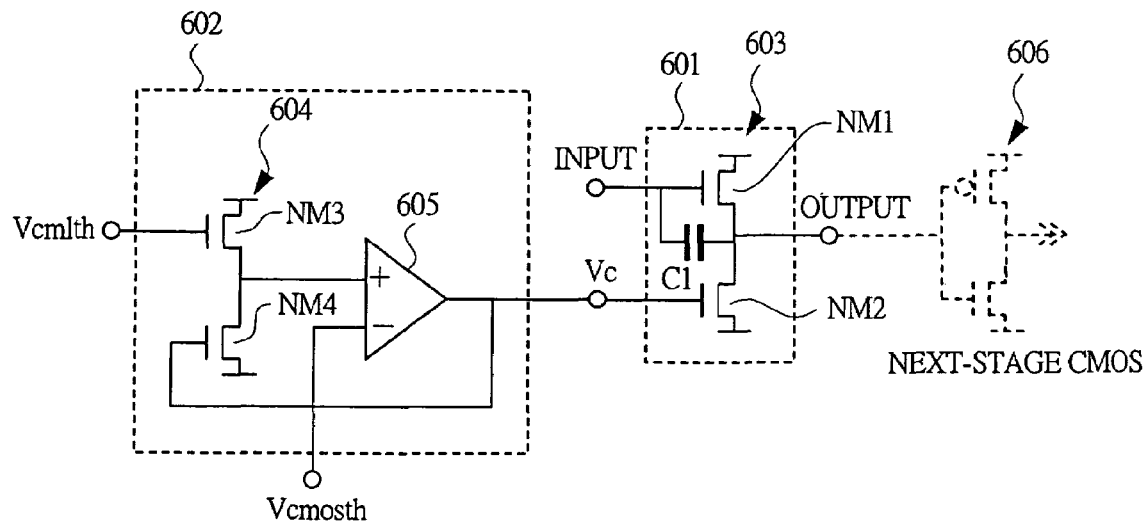
FIG. 6 is a block diagram showing a basic configuration of a level conversion circuit according to an embodiment of the present invention.

FIG. 6 is a block diagram showing a basic configuration of a level conversion circuit according to an embodiment of the present invention.

First, with reference to FIG. 6, one example of basic configuration of the level conversion circuit according to the embodiment of the present invention will be described. The level conversion circuit of the present embodiment is a circuit for converting an AC signal from a CML level to a CMOS level. For example, the description will be made with a CML level of 0.9V/1.2V and a CMOS level of 0V/1.2V.

The level conversion circuit of the present invention is configured by: a level shift circuit 601 including a source follower circuit 603 and a coupling capacitor C1; and a control-voltage generating circuit 602, for example. The source follower circuit 603 is configured by: an n-MOS transistor NM1 having a drain connected to a power source, a gate connected to an input, and a source connected to an output; and an n-MOS transistor NM2 having a drain connected to an output, a gate connected to a control voltage Vc, and a source connected to the ground. Between the input and output of the source follower circuit 603, the coupling capacitor C1 is connected. To the output of the source follower circuit 603, a next-stage CMOS circuit 606 such as an inverter circuit is connected.

The control-voltage generating circuit 602 is configured by: a replica source follower circuit 604 which is a replica (dummy) of the source follower circuit 603; and a comparator 605 such as operational amplifier. The replica source follower circuit 604 is configured by: an n-MOS transistor NM3 having a drain connected to a power source, a gate connected to a threshold voltage of a CML circuit Vcmlth (central voltage of a CML circuit) and a source connected to an input of the comparator 605; and an n-MOS transistor NM4 having a drain connected to an input of the comparator 605, a gate connected to the control voltage Vc, and a source connected to the ground. The comparator 605 gets inputs of an output of the replica source follower circuit 604 and a threshold voltage of a next-stage CMOS circuit Vcmosth and outputs the control voltage Vc.

Herein, the "replica (dummy)" means a duplication of a reference circuit having similar characteristics. As one example, threshold voltages of the transistors are matched, sizes of the transistor NM1 and the transistor NM3 are made to be equal, sizes of the transistor NM2 and the transistor NM4 are made to be equal. Further, even when the transistor sizes and threshold voltages are not completely identical, same effects can be obtained in a situation where a threshold voltage of the transistor NM1 and that of the transistor NM3 are equal, a threshold voltage of the transistor NM2 and that of the transistor NM4 are equal, and a size ratio between the transistor NM1 and the transistor NM2 and that between the transistor NM3 and the transistor NM4 are equal.

Low-power/high-speed operation of the first problem is solved by the level shift circuit 601. In this level shift circuit 601, the source follower circuit 603 handles a DC-like level-shift operation and the coupling capacitor C1 handles an AC-like level-shift operation. According to this configuration, since an operation speed is determined by the AC-like operation, a high-speed operation is possible even when a DC current is suppressed, thereby realizing lower power consumption. Note that, an AC-like gain of this circuit is a ratio between the coupling capacitor C1 and an input capacitance of the next-stage CMOS circuit 606. Therefore, the coupling capacitor C1 is required to have a sufficiently large value, for example, more than five-times larger than the input capacitance of the next-stage CMOS circuit.

Variations in input/output characteristics due to an environment variation (such as variations in source voltage and temperature) and device variation of the second problem is solved by compensating a gate voltage of the transistor NM2 of a lower-stage of the source follower circuit 603 by the control-voltage generating circuit 602. The control-voltage generating circuit 602 is a negative feedback circuit configured by the replica source follower circuit 604 which is a replica of the source follower circuit 603 in the level shift circuit 601 and the comparator 605 such as operational amplifier. According to this configuration, when the threshold voltage of a next-stage CMOS circuit Vcmosth is applied to a negative input of the comparator 605, an output thereof always matches the threshold voltage of a next-stage CMOS circuit Vcmosth independently of an input voltage of the replica source follower circuit 604. At this time, by an application of a central voltage of CML circuit (threshold voltage of a CML circuit Vcmlth) to the input of the replica source follower circuit 604, the control-voltage generating circuit 602 outputs the control voltage Vc so as to always match an output of the source follower circuit 603 and the threshold voltage of a next-stage CMOS circuit Vcmosth even when variations in source voltage and temperature and device variation occur.

In this manner, even when variations in source voltage and temperature and device variation occur, the input/output characteristics, i.e., the threshold voltage of a level conversion circuit Vcth is always unvaried, thereby enabling suppression of variation in the Duty ratio.

As described above, this circuit system requires the threshold voltage of a CML circuit Vcmlth (central voltage of CML circuit) which is an input to the control-voltage generating circuit 602 and the threshold voltage of a next-stage CMOS circuit Vcmosth, and thus precisions of these voltages are also important. As for the threshold voltage of a CML circuit Vcmlth, it is possible to generate with a sufficient precision by using a replica circuit of the CML circuit. Also as for the threshold voltage of a next-stage CMOS circuit Vcmosth, it is essential for obtaining the effects of the present level conversion circuit. Next, its circuit configuration example will be described.

Figure 7A:
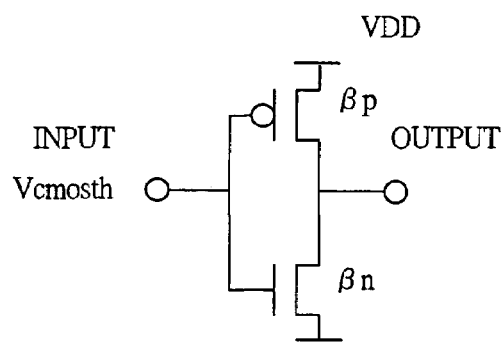
FIG. 7A is a diagram showing a circuit configuration of an ideal CMOS circuit.
Figure 7B:
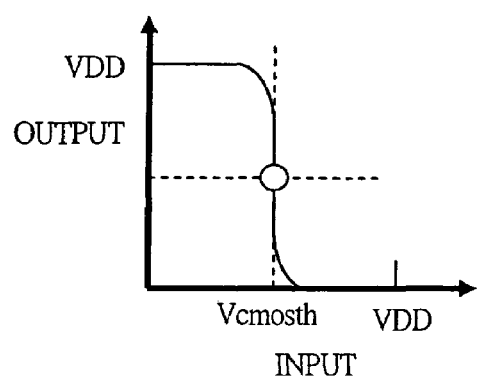
FIG. 7B is a diagram showing an input/output characteristic of the ideal CMOS circuit.

First, it is necessary to figure out influences on the threshold voltage of a CMOS circuit due to variations in source voltage and temperature and device variation. FIG. 7A and FIG. 7B are diagrams respectively showing a circuit configuration and an input/output characteristic of an ideal CMOS circuit.

In a state where a threshold voltage of a CMOS circuit Vcmosth is applied to an input of the CMOS circuit, as shown in FIGS. 7A and 7B, assuming that both of a p-MOS transistor and an n-MOS transistor are operated within a saturation region, the following formulas are defined. Herein, transconductances of the p-MOS transistor and the n-MOS transistor are βp and βn, threshold voltages of the p-MOS transistor and the n-MOS transistor are Vthp and Vthn, and drain currents of the p-MOS transistor and the n-MOS transistor are Idsp and Idsn.

$$Idsn = \beta n \times (Vcmosth - Vthn)^2 = Idsp$$
$$= \beta p \times (VDD - Vcmosth - Vthp)^2$$

Herein, when it is further designed to make βn=βp, the following is defined.

$$Vcmosth = VDD/2 + (Vthn - Vthp)/2$$

It is shown that the threshold voltage of a CMOS circuit Vcmosth depends on the source voltage VDD and a difference between the threshold voltages of the MOS transistors Vthp and Vthn. Therefore, it is necessary to make the threshold-voltage generating circuit of a CMOS circuit to have a circuit having the above dependency.

Figure 8:
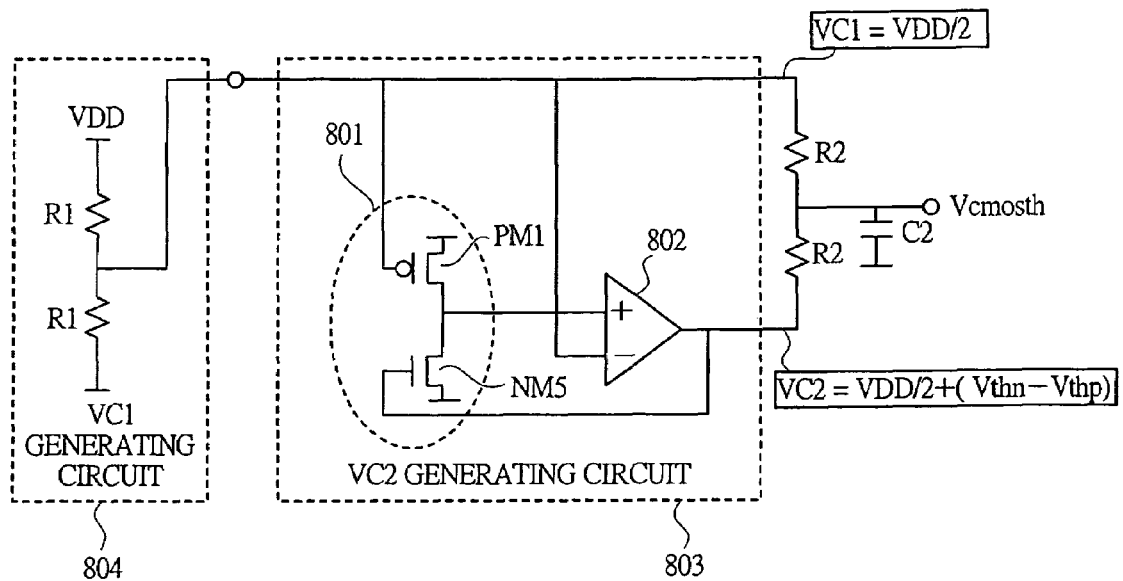
FIG. 8 is a circuit diagram showing a configuration example of a threshold-voltage generating circuit for CMOS circuit of the level conversion circuit according to the embodiment of the present invention.

FIG. 8 shows a basic configuration of a threshold-voltage (Vcmosth) generating circuit of CMOS circuit having this dependency. This circuit is configured by: a VC2 generating circuit 803 including a replica CMOS circuit 801 which is a replica of the next-stage CMOS circuit 606 and a comparator 802 such as an operational circuit; and a VC1 generating circuit 804 generating a voltage of half of the source voltage VDD. The VC1 generating circuit 804 divides the source voltage VDD by resistances R1, thereby generating a voltage of VDD/2. In the VC2 generating circuit 803, assuming that both of a p-MOS transistor PM1 and an n-MOS transistor NM5 of the replica CMOS circuit 801 are operated within a saturation region, currents of respective transistors are defined as follows. Herein, transconductances of the p-MOS transistor PM1 and the n-MOS transistor NM5 are βp and βn, threshold voltages of the p-MOS transistor PM1 and the n-MOS transistor NM5 are Vthp and Vthn, and drain currents are Idsp and Idsn.

$$Idsn = \beta n \times (VC2 - Vthn)^2 = Idsp$$
$$= \beta p \times (VDD/2 - Vthp)^2$$

Herein, when it is designed to make βn=βp, the following is defined.

$$VC2 = VDD/2 + (Vthn - Vthp)$$

Therefore, the threshold voltage of a CMOS circuit Vmosth as an output of the threshold-voltage generating circuit of a CMOS circuit is a voltage obtained by dividing VC1 and VC2 by two by the resistances R2 as shown in the following formula.

$$Vcmosth = VDD/2 + (Vthn - Vthp)/2$$

As described above, by the use of the present circuit, a voltage equal to the threshold voltage of a CMOS circuit Vcmosth shown in FIG. 7 can be generated.

Figure 9:
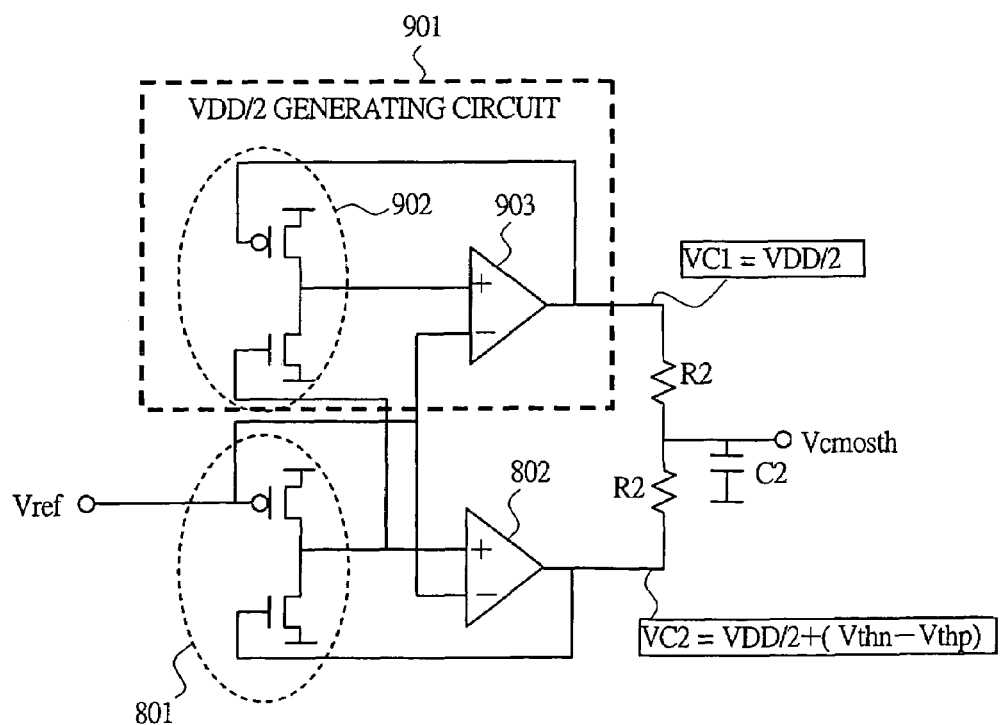
FIG. 9 is a circuit diagram showing another configuration example of the threshold-voltage generating circuit for CMOS circuit of the level conversion circuit according to the embodiment of the present invention.

FIG. 9 shows another configuration example of the threshold-voltage generating circuit of a CMOS circuit.

The circuit in FIG. 9 uses a VDD/2 generating circuit 901 to generate VC1. This circuit enables flowing large current to VC1. The VDD/2 generating circuit 901 is a negative feedback circuit configured by a replica CMOS circuit 902 which is a replica of the next-stage CMOS circuit 606 and a comparator 903 such as an operational amplifier. According to this configuration, the circuit is in consideration of the saturation characteristics of MOS transistors. VDD/2 is applied to a reference voltage Vref. The comparator 903 controls VC1, so that an output voltage of the replica CMOS circuit 902 and Vref (=VDD/2) become equal. Further, the comparator 802 controls VC2, so that an output of the replica CMOS circuit 801 and Vref (=VDD/2) become equal. Note that, in the circuit of FIG. 9, a capacitance C2 can be a small capacitance value.

Figure 10:
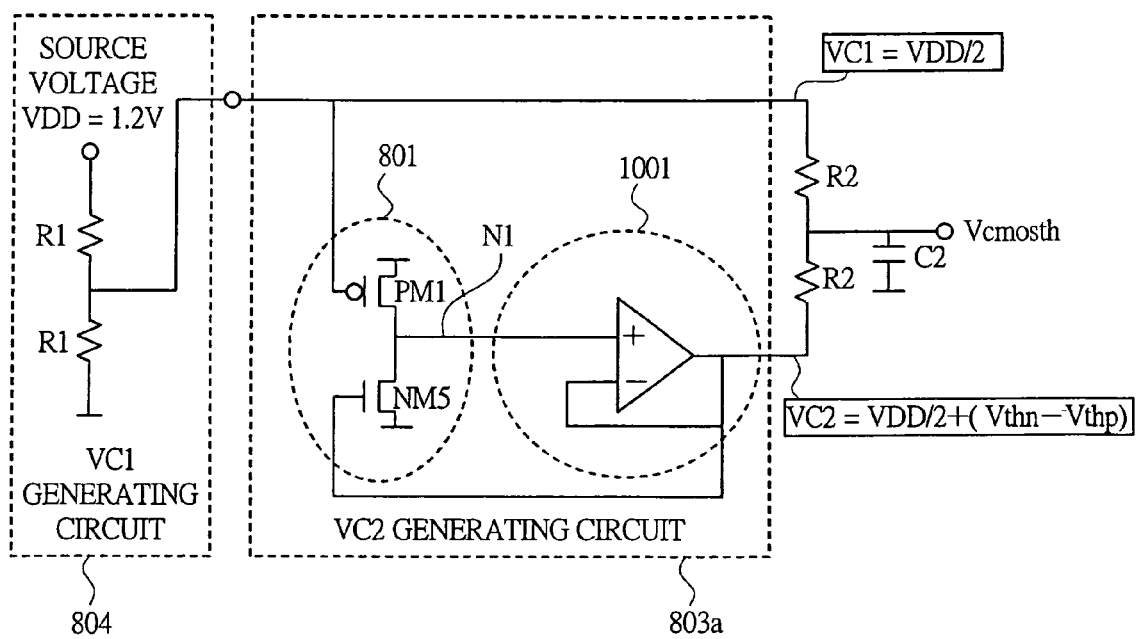
FIG. 10 is a circuit diagram showing still another configuration example of the threshold-voltage generating circuit for CMOS circuit of the level conversion circuit according to the embodiment of the present invention.

FIG. 10 shows still another configuration example of the threshold-voltage generating circuit of a CMOS circuit. This circuit has exactly the same VC1 generating circuit 804 compared with the representative example of threshold-voltage generating circuit of a CMOS circuit in FIG. 8. A difference from FIG. 8 is that an operational amplifier of a VC2 generating circuit 803a in FIG. 10 forms a voltage follower circuit 1001 instead of a comparator. A potential VN1 of a node N1 is represented by $$VN1 = VDD/2 + (Vthn - Vthp)$$

as described in FIG. 8. An output voltage VC2 of the VC2 generating circuit 803a is also made by the voltage follower circuit 1001 to be $$VC2 = VN1$$

so that a threshold voltage of a CMOS circuit Vcmosth similar to that of the threshold-voltage generating circuit of a CMOS circuit in FIG. 8 is obtained.

Figure 11:
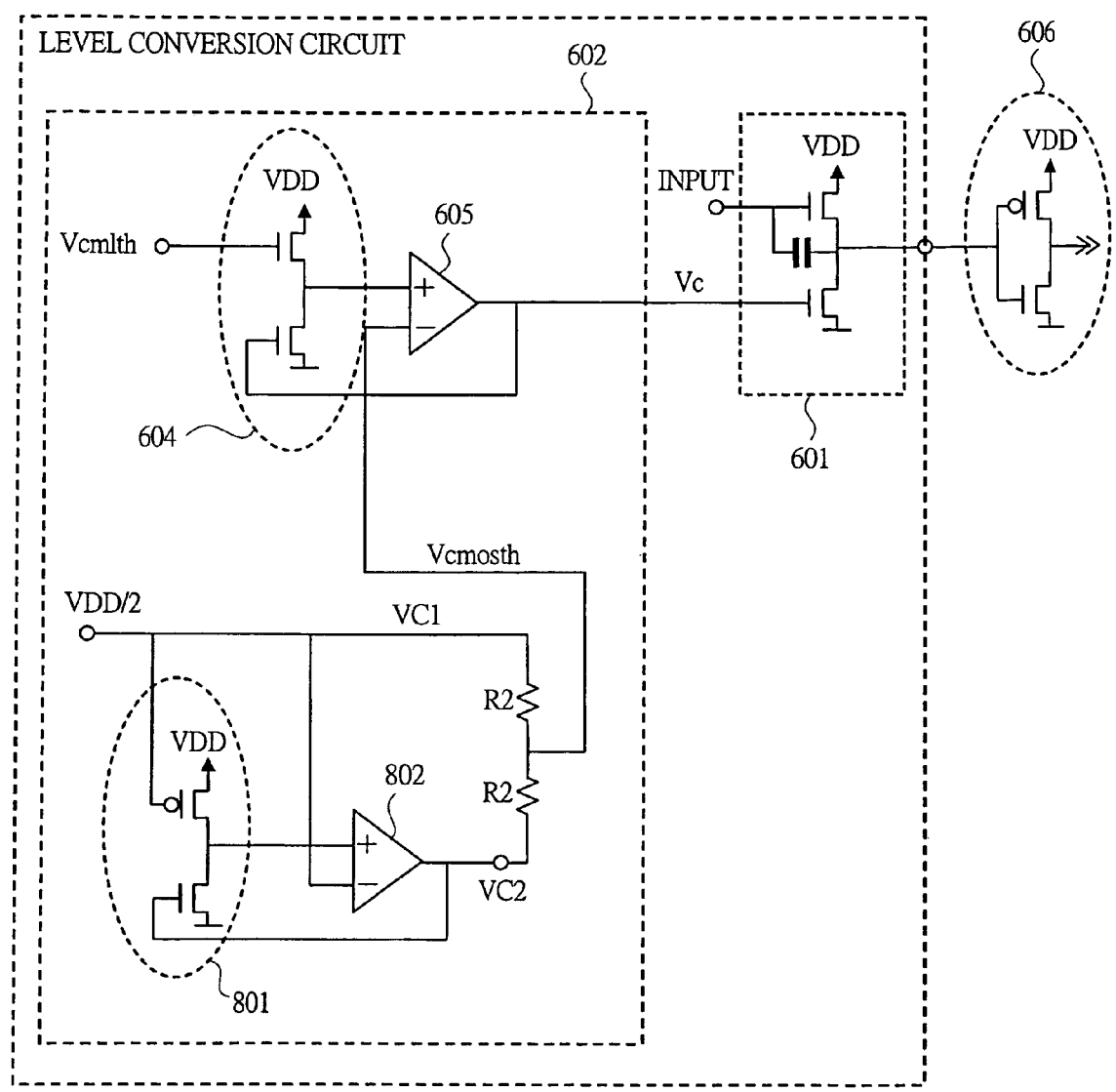
FIG. 11 is a circuit diagram showing an entire configuration of the level conversion circuit according to the embodiment of the present invention.

FIG. 11 is a circuit diagram showing an entire configuration of the level conversion circuit according to the embodiment of the present invention. In FIG. 11, for example, the source voltage VDD is 1.2V, VDD/2 is 0.6V, and the threshold voltage of a CML circuit Vcmlth is 1.05V.

As described in the foregoing, problems in the level conversion circuit promising application of SerDes are power reduction and distortion reduction of output-pulse width due to variations in source voltage and temperature and device variation. In order to solve these problems, based on a source follower circuit, a low-power level conversion circuit that controls the amount of level shift by a voltage of a lower-stage MOS transistor of the source follower circuit is invented.

The above-described level conversion circuit is configured by: a source follower circuit to handle DC-like level-shifts including two MOS transistors; and a coupling capacitor to handle AC-like level shifts connected between input and output of the source follower circuit. This configuration achieves power reduction by reducing DC current of the source follower circuit which is a DC path.

Further, As a threshold-voltage generating circuit of a next-stage CMOS circuit, a circuit which generates a threshold voltage by a replica circuit of the next-stage CMOS circuit and a comparator (operational amplifier etc.) is devised. The present circuit controls a gate voltage of a lower-stage MOS transistor of the source follower circuit by the threshold voltage of a next-stage CMOS circuit, thereby compensating distortion of output-pulse width due to variations in source voltage and temperature and device variation.

The present circuit system is foreseeable to obtain an advantage of about realizing ⅛ of power, and as for the variation amount of Duty ratio, 1 ps or less, i.e., reduction to be about ⅕ compared to the conventional circuit using 90 nm CMOS. The amount of Duty ratio herein means a variation amount of the output-pulse width of the level conversion circuit.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is applicable to manufacturing of semiconductor devices, electronic devices and the like.

What is claimed is:

1. A level conversion circuit comprising: a source follower circuit including a first transistor to input an AC signal of CML level thereto and a second transistor to input a control voltage thereto; and a control-voltage generating circuit generating the control voltage to be inputted to the second transistor, wherein the control-voltage generating circuit comprises:
a replica of the source follower circuit including a third transistor to input a central voltage of CML level thereto and a fourth transistor to input the control voltage thereto; and
a comparison circuit controlling the control voltage so as to equalize an output voltage of the replica of the source follower circuit and a threshold voltage of a next-stage CMOS circuit; and
wherein the threshold voltage of a next-stage CMOS circuit is VDD/2+(Vthn−Vthp)/2 when assuming that a source voltage to be applied to the source follower circuit is VDD, a threshold voltage of the first transistor is Vthp, and a threshold voltage of the second transistor is Vthn.

2. The level conversion circuit according to claim 1,
wherein the source follower circuit has a capacitance between an input part to input a CML-level signal and an output part to output a CMOS-level signal thereto, the capacitance being equal to or more than five times an input capacitance of a circuit connected at a next stage.

3. A level conversion circuit comprising: a source follower circuit including a first transistor to input an AC signal of CML level thereto and a second transistor to input a control voltage thereto; a control-voltage generating circuit generating the control voltage to be inputted to the second transistor; and a threshold-voltage generating circuit of a CMOS circuit that generates the threshold voltage of a next-stage CMOS circuit, wherein the control-voltage generating circuit comprises:
a replica of the source follower circuit including a third transistor to input a central voltage of CML level thereto and a fourth transistor to input the control voltage thereto; and
a comparison circuit controlling the control voltage so as to equalize an output voltage of the replica of the source follower circuit and a threshold voltage of a next-stage CMOS circuit; and
wherein the threshold-voltage generating circuit of a CMOS circuit includes a replica of a CMOS circuit connected to a next stage of the source follower circuit.

4. The level conversion circuit according to claim 3,
wherein the source follower circuit has a capacitance between an input part to input a CML-level signal and an output part to output a CMOS-level signal thereto, the capacitance being equal to or more than five times an input capacitance of a circuit connected at a next stage.

* * * * *